United States Patent
Prakash et al.

(10) Patent No.: US 7,915,806 B2
(45) Date of Patent: Mar. 29, 2011

(54) ELECTRONIC DEVICE INCLUDING AN ORGANIC DEVICE LAYER

(75) Inventors: Shiva Prakash, Santa Barbara, CA (US); Nugent Truong, Ventura, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 689 days.

(21) Appl. No.: 11/960,351

(22) Filed: Dec. 19, 2007

(65) Prior Publication Data

US 2008/0160270 A1   Jul. 3, 2008

Related U.S. Application Data

(60) Provisional application No. 60/877,569, filed on Dec. 28, 2006.

(51) Int. Cl.
*H01J 1/62* (2006.01)

(52) U.S. Cl. .................................. 313/504; 428/690

(58) Field of Classification Search .......... 313/503–506; 428/690; 445/23–25
See application file for complete search history.

(56) References Cited

OTHER PUBLICATIONS

CRC Handbook of Chemistry and Physics, $81^{ST}$ Edition, 2000-2001.

*Primary Examiner* — Joseph L Williams
(74) *Attorney, Agent, or Firm* — John H. Lamming (57) ABSTRACT

An electronic device can include an organic device layer having a first and a second portion. In one embodiment, the first portion can have a higher resistivity than the second portion and lie between a first and a second electrode and include not more than 15 mole percent basic material. In a particular embodiment, the first and the second electrode can be an anode and cathode of a pixel. In another particular embodiment, the first and the second electrode can be either both anodes or both cathodes of different pixels. In another embodiment, the organic device layer can include a large molecule material. In still another embodiment, a process of forming the electronic device can include selectively modifying the first portion of the organic device layer.

10 Claims, 3 Drawing Sheets

ELECTRONIC DEVICE INCLUDING AN ORGANIC DEVICE LAYER

BACKGROUND INFORMATION

1. Field of the Disclosure

This disclosure relates in general to electronic devices and, more specifically to electronic devices including a film.

2. Description of the Related Art

Electronic devices, including organic electronic devices, continue to be more extensively used in everyday life. Forming circuits in such electronic devices includes forming conductive pathways in polymer layers such as those that lie between electrodes of the electronic device. One method is to form a conductive structure by removing portions of a previously formed conductive layer. Another method is to print the conductive structure using a selective deposition technique. Insulating material can be deposited between such conductive structures to provide electrical insulation and planarization. When the insulating material is blanket deposited, openings are made in the insulating layer such that the conductive structures can be electrically connected to form conductive pathways. Another method is to form a well within bank structures such that a conductive liquid deposited over the bank structures collects in the wells to form conductive structures. However uniform formation and fill of many individual structures can be difficult to control.

An alternative attempt to form a conductive structure is to deposit a layer of polymer precursors that has been stabilized with a basic material. The polymer precursor layer is selectively exposed to UV radiation and subsequently heated to form a polymer layer. In such a case, the polymer formed in the exposed region is a nonconductive polymer, and the polymer formed in the unexposed region is a conductive polymer.

SUMMARY

An electronic device can include an organic device layer. In a first aspect, a process of forming an electronic device can include forming an organic device layer that includes a large molecule material, and selectively modifying the organic device layer, wherein a first portion of the organic device layer is modified.

In a second aspect, an electronic device can include a first electrode, a second electrode, and the organic device layer. The organic device layer can include a first portion and a second portion that has a lower resistivity than the first portion. The organic device layer can lie between the first and second electrodes, and include a large molecule material and not more than 15 mole percent of a basic material.

In a third aspect, an electronic device can include a first pixel including a first electrode, a first portion of the organic device layer, and a first organic active film. The first pixel can also include a first portion of a common electrode, wherein the first portion of the organic device layer and the first organic active film lie between the first electrode and the first portion of the common electrode, and the organic device layer includes not more than 15 mole percent basic material. The electronic device can also include a second pixel including a second electrode, a second portion of the organic device layer, and a second organic active film. The second pixel can also include a second portion of the common electrode, wherein the second portion of the organic device layer and the second organic active film lie between the second electrode and the second portion of the common electrode. The electronic device can further include a third pixel including a third electrode, a third portion of the organic device layer, and a third organic active film. The third pixel can also include a third portion of the common electrode, wherein the third portion of the organic device layer and the third organic active film lie between the third electrode and the third portion of the common electrode. The electronic device can still further include a fourth portion of the organic device layer lying between the first pixel and the second pixel, and having a higher resistivity than each of the first portion and the second portion of the organic device layer. The electronic device can yet further include a fifth portion of the organic device layer lying between the second pixel and the third pixel, and having a higher resistivity than each of the second portion and the third portion of the organic device layer.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

An electronic device can include an organic device layer. In a first aspect, a process of forming an electronic device can include forming an organic device layer that includes a large molecule material, and selectively modifying the organic device layer, wherein a first portion of the organic device layer is modified.

In a second aspect, an electronic device can include a first electrode, a second electrode, and an organic device layer. The organic device layer can include a first portion and a second portion that has a lower resistivity than the first portion. The organic device layer can lie between the first and second electrodes, and include a large molecule material and not more than 15 mole percent of a basic material.

In one embodiment of the first aspect, forming the organic device layer can include forming a charge-selective film, and selectively modifying the organic device layer is performed before forming another film on the charge-selective film. In another embodiment, selectively modifying the organic device layer can include selectively exposing the organic device layer to a wavelength of radiation having a value not greater than 360 nm. In still another embodiment, selectively modifying the organic device layer can be performed at a peak intensity of at least 10 J/cm$^2$ at a surface within the first portion of the organic device layer.

In another embodiment of the first aspect, selectively modifying the organic device layer includes exposing the first portion of the organic device layer to a particle beam. In still another embodiment, selectively modifying the organic device layer is performed in the presence of an oxygen-containing material.

In a particular embodiment, selectively modifying the organic device layer further includes placing a stencil mask between a radiation source and a charge-selective film of the organic device layer, and selectively exposing the charge-selective film such that substantially unattenuated radiation reaches a first portion of the charge-selective film and attenuated radiation is substantially prevented from reaching a second portion of the charge-selective film. In a more particular embodiment, forming the charge-selective film includes forming a doped buffer film. A still more particular embodiment can further include forming a charge-transfer film, prior to selectively modifying the charge-selective film. In another more particular embodiment, after selectively exposing the charge-selective film, the first portion of the charge-selective film has a higher resistivity than the second portion of the charge-selective film. In another embodiment, the large molecule material of the organic device layer includes a sulfonate-containing material.

In a second aspect, an electronic device can include a first electrode, a second electrode, and an organic device layer. The organic device layer can include a first portion and a second portion that has a lower resistivity than the first portion. The organic device layer can lie between the first and second electrodes, and include a large molecule material and not more than 15 mole percent of a basic material.

In one embodiment of the second aspect, the organic device layer can include substantially no basic material. In a particular embodiment, the first portion of the organic device layer lies between the first electrode and second electrode. In a more particular embodiment, the electronic device can further include a first organic active film, wherein the organic device layer lies between the first organic active film and the first electrode. In an even more particular embodiment, the electronic device can further include a substrate, wherein the first electrode and the second electrode each lie between the organic device layer and the substrate. In a still more particular embodiment, the second portion of the organic device layer overlies the first electrode.

In an even more particular embodiment of the second aspect, the electronic device can further include a second organic active film overlying the second electrode and the organic device layer, wherein substantially none of the first organic active film overlies the second electrode, and substantially none of the second organic active film overlies the first electrode. Also, the first organic active film and the second organic active film overlie the first portion of the organic device layer.

In another even more particular embodiment of the second aspect, the electronic device can further include a second organic active film overlying the second electrode and a third portion of the organic device layer. Substantially none of the first organic active film can overlie the second electrode, substantially none of the second organic active film can overlie the first electrode, and the first organic active film can overlie the second portion of the organic device layer. The first portion of the organic device layer can lie between the second portion and the third portion of the organic device layer, and the third portion of the organic device layer can have a lower resistivity than the first portion of the organic device layer. In another particular embodiment, the organic device layer and the first organic active film lie between the first and second electrodes.

In a third aspect, an electronic device can include a first pixel including a first electrode, a first portion of a organic device layer, and a first organic active film. The first pixel can also include a first portion of a common electrode, wherein the first portion of the organic device layer and the first organic active film lie between the first electrode and the first portion of the common electrode, and the organic device layer includes not more than 15 mole percent basic material. The electronic device can also include a second pixel including a second electrode, a second portion of the organic device layer, and a second organic active film. The second pixel can also include a second portion of the common electrode, wherein the second portion of the organic device layer and the second organic active film lie between the second electrode and the second portion of the common electrode. The electronic device can further include a third pixel including a third electrode, a third portion of the organic device layer, and a third organic active film. The third pixel can also include a third portion of the common electrode, wherein the third portion of the organic device layer and the third organic active film lie between the third electrode and the third portion of the common electrode. The electronic device can still further include a fourth portion of the organic device layer lying between the first pixel and the second pixel, and having a higher resistivity than each of the first portion and the second portion of the organic device layer. The electronic device can yet further include a fifth portion of the organic device layer lying between the second pixel and the third pixel, and having a higher resistivity than each of the second portion and the third portion of the organic device layer.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Fabrication of an Electronic Device, Electronic Device and Its Operation, and finally, Advantages.

1. Definitions and Clarification of Terms

Before addressing details of embodiments described below, some terms are defined or clarified.

The term "buffer layer" or "buffer material" is intended to mean that the layer or material is formed using electrically conductive materials and may have one or more functions in an electronic device, including planarization of the underlying layer, charge-transport or charge-injection properties, other aspects to facilitate or to improve the performance of the electronic device, or any combination thereof. Buffer materials include large molecules, solutions, dispersions, suspensions, emulsions, colloidal mixtures, other compositions, or any combination thereof.

The term "charge-blocking," when referring to a layer or material, is intended to mean such layer or material reduces the likelihood that a charge migrates into another layer or material.

The term "charge-injecting," when referring to a layer or materials intended to mean such layer or material promotes charge migration into an adjacent layer, material.

The term "charge-selective," is intended to mean charge-blocking, charge-injecting, charge-transport, or any combination thereof.

The term "charge-transport," when referring to a layer or material is intended to mean such layer or material facilitates migration of such charge through the thickness of such layer or material with relative efficiency and small loss of charge.

The term "film" is intended to mean a discrete unit within a layer. A layer can be as little as a single film or can include a combination of films.

The term "large molecule," when referring to a compound, is intended to mean a compound, which has repeating monomeric units. In one embodiment, a large molecule has a molecular weight greater than 2,000 g/mol.

The term "layer" is intended to mean one or more layers, one or more films, or any combination of layer(s) and film(s) that have a common characteristic or serve a common purpose or function.

The term "modifying" and its variants is intended to mean a process under which a layer, material, or any combination thereof, is exposed to radiation and undergoes an irreversible change without introducing any additional material into such layer, material, or any combination thereof during the process.

The term "organic active film" is intended to mean an organic film, by itself, or when in contact with a dissimilar material capable of forming a rectifying junction.

The term "organic device layer" is intended to mean a layer that (i) includes an organic material, (ii) includes a charge-selective film, an organic active film, or any combination thereof, and (iii) lies between electrodes within an electronic component.

The term "precision deposition technique" is intended to mean a deposition technique that is capable of depositing one or more materials over a substrate in a pattern to a thickness no greater than approximately one millimeter. A stencil mask, frame, well structure, patterned layer or other structure(s) may or may not be present during such deposition.

The term "radiation" is intended to mean energy in the form of waves or particles. Radiation may be within the visible-light spectrum, outside the visible-light spectrum (UV or IR). Radiation can also include radioactivity or another particle emission, such as an electron or other particle beam.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or infrared ("IR")). A light-emitting diode is an example of a radiation-emitting component.

The term "radiation-responsive component" is intended to mean an electronic component, which when properly biased, can respond to radiation at a targeted wavelength or spectrum of wavelengths. The radiation may be within the visible-light spectrum or outside the visible-light spectrum (UV or IR). An IR sensor and a photovoltaic cell are examples of radiation-sensing components.

The term "small molecule," when referring to a compound, is intended to mean a compound which does not have repeating monomeric units. In one embodiment, a small molecule has a molecular weight no greater than 2000 g/mol.

The term "ultra-violet" ("UV") is intended to mean radiation that has an emission maximum at a wavelength less than approximately 360 nm. As used herein, x-rays are an example of ultra-violet radiation.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, $81^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Fabrication of an Electronic Device

Figure 1:
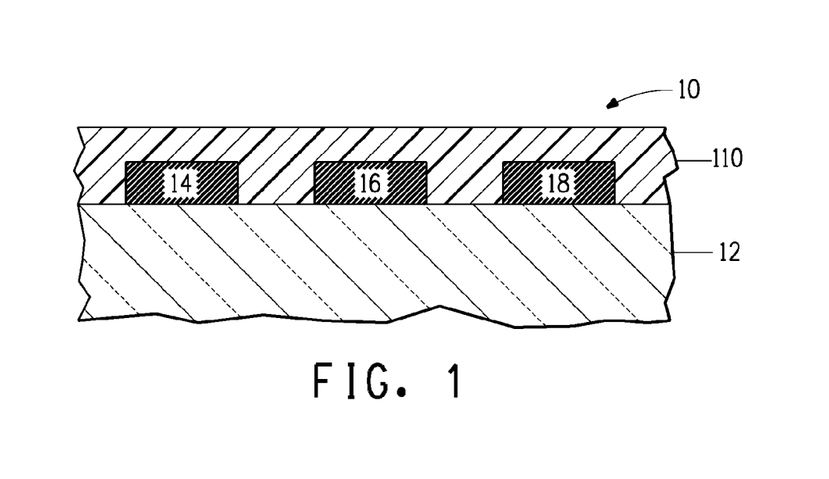
FIG. 1 includes an illustration of a cross-sectional view of a workpiece including a substrate, electrodes, and a charge-selective layer.

FIG. 1 includes an illustration of a cross-sectional view of a workpiece 10 including a substrate 12. In the illustrated embodiment, the workpiece 10 includes electrodes 14, 16, and 18, and an organic device layer 110.

The substrate 12 can be either rigid or flexible and may include one or more layers of one or more materials such as glass, polymer, metal or ceramic materials, or combinations thereof. In one embodiment, the substrate 12 is substantially transparent to a targeted wavelength or spectrum of wavelengths associated with the electronic device. Pixel control or other circuits (not illustrated) can be formed within or over the substrate 12 using conventional or proprietary techniques.

In the illustrated embodiment, the electrodes 14, 16, and 18 serve as electrodes for electronic components, such as OLEDs. The electrodes 14, 16, and 18 have a work function of approximately 4.4 eV or higher. In a particular embodiment, the electrodes 14, 16, and 18 can include InSnO, AlZnO, AlSnO, ZrSnO, another suitable material used for an anode in an OLED, or any combination thereof. The electrodes 14, 16, and 18 have a thickness in a range of approximately 10 to 1000 nm. The electrodes 14, 16, and 18 are formed by a deposition using a conventional or proprietary technique. The electrodes 14, 16, and 18 may include the same material or different materials, have the same or different thicknesses, be formed using the same or different technique, be formed at the same or different time, or any combination thereof.

Although not illustrated, a structure (e.g., a well structure, cathode separators, or the like) may lie adjacent to the electrode 14, 16, 18, or any combination thereof to reduce the likelihood of materials from different organic active layers from contacting each other at locations above the electrode 14, 16, 18, or any combination thereof.

In the illustrated embodiment, the organic device layer 110 includes a charge-selective layer, and more particularly, a charge-injection layer (electron-injection or hole-injection layer). The organic device layer 110 is a doped buffer layer and is formed over the electrodes 14, 16, and 18. The organic device layer 110 includes a conventional or proprietary material that is suitable for use in a charge-injection layer (e.g., a doped buffer layer). In one embodiment, the organic device layer 110 includes a large molecule material, such as polypyrrole, polyvinylcarbazole, (phenylmethyl)polysilane, poly(dioxythiophenes) ("PEDOT"), polyaniline ("PANI"), another material conventionally used as a hole-injection layer, or any combination thereof. In a more particular embodiment, the organic device layer 110 also includes a material, such as polystyrene or polycarbonate.

The organic device layer 110 has a thickness in a range of approximately 50 to 500 nm, and in another embodiment, can be thicker or thinner than the recited range. Any individual or combination of films within the organic device layer 110 can be formed by a conventional or proprietary deposition technique and may be cured after deposition. In one embodiment, the organic device layer 110 is formed by a liquid deposition technique.

Figure 2:
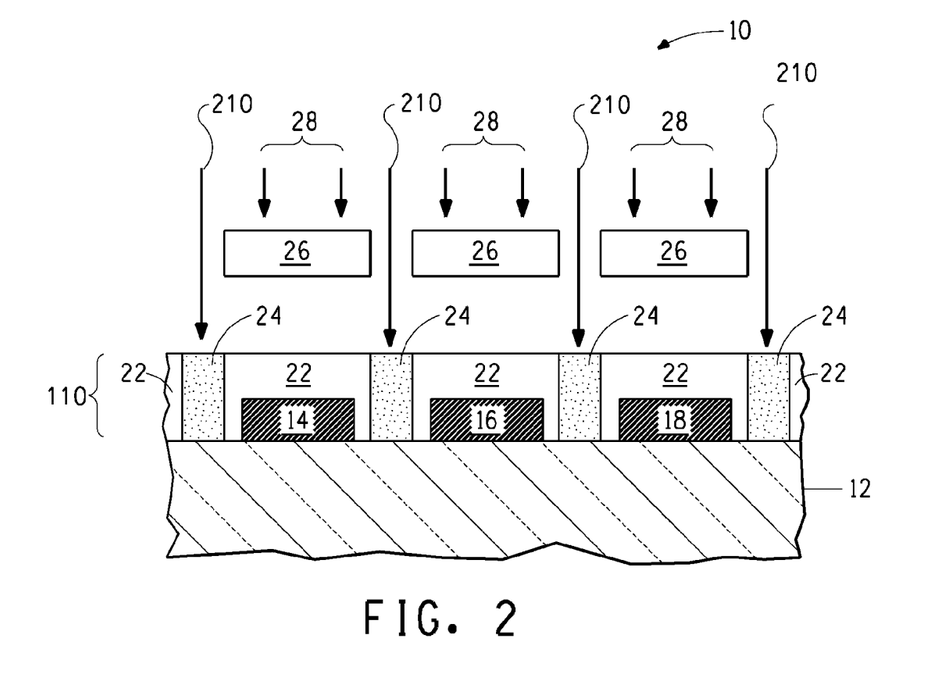
FIG. 2 includes an illustration of a cross-sectional view of the workpiece of FIG. 1 while selectively modifying a portion of the charge-selective layer.

FIG. 2 includes an illustration of the workpiece 10 while selectively modifying the organic device layer 110. In the illustrated embodiment, selectively modifying includes selectively exposing a first portion 22 of the organic device layer 110 to radiation 210. The workpiece 10 is arranged such that a stencil mask 26 lies between a radiation source (not illustrated) and the workpiece 10. Radiation 210 is unattenuated and reaches the first portion 22 of the layer 110. Radiation 28 is attenuated and substantially prevented from reaching a second portion 24 of the organic device layer 110 by the stencil mask 26. In a particular embodiment, wavelength of the radiation 210 has a value not greater than approximately 360 nm. In a more particular embodiment, the radiation 210 includes UV-A radiation, UV-B radiation, UV-C radiation, or any combination thereof. In an even more particular embodiment, the radiation 210 is UV-C radiation with a wavelength in a range of approximately 200 to approximately 280 nm.

In another particular embodiment, the radiation 210 has a peak intensity of at least 10 J/cm$^2$ at the surface of the organic device layer 110. In another embodiment, the radiation 210 can include a particle beam (e.g., an electron beam). In still another embodiment, selectively modifying the organic device layer 110 is performed in an environment with an oxygen-containing material, such as oxygen, water, an alcohol, a glycol, another oxygen-containing organic material, or any combination thereof. In one embodiment, the oxygen-containing material lies within the organic device layer 210 or an immediately adjacent layer. After selective modification of the organic device layer 110, the first portion 22 has a higher resistivity than the second portion 24. In a particular embodiment, the first portion 22 has a resistivity at least two orders of magnitude higher than the second portion 24. In a more particular embodiment, a substantially insulating pattern is formed by the first portion 22 within the organic device layer 110.

Figure 3:
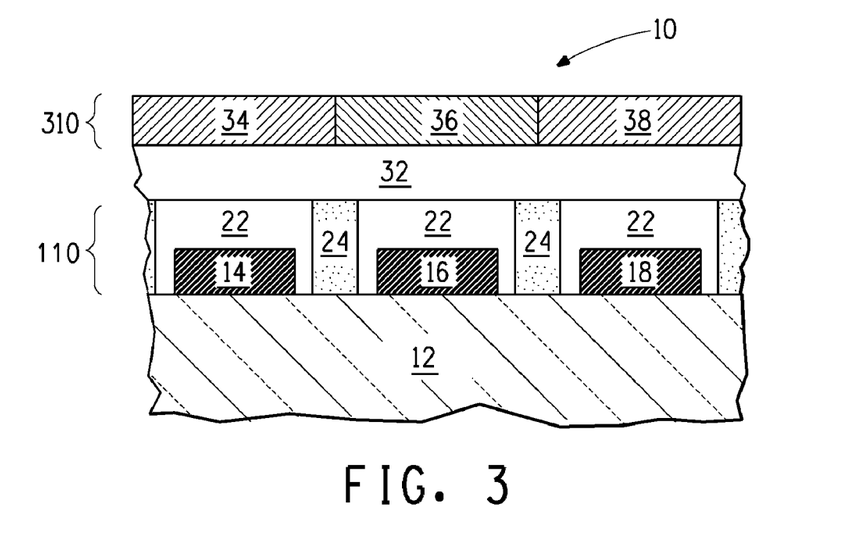
FIG. 3 includes an illustration of a cross-sectional view of the workpiece of FIG. 2 after forming a charge-selective layer and an organic active layer.

FIG. 3 includes an illustration of the workpiece 10 after forming a charge-selective layer 32 and an organic active layer 310. The charge-selective layer 32 is an optional layer. In the illustrated embodiment, the charge-selective layer 32 serves as a charge-transport layer to help transport charges from the electrode 14, 16, and 18 to the organic active layer 310. The charge-selective layer 32 includes a material previously described for the organic device layer 110 or another material typically used to form charge-selective layers. The charge-selective layer 32 is formed using an embodiment previously described with respect to the organic device layer 110. The charge-selective layer 32 includes the same or different material as the organic device layer 110 and is deposited using the same or different, conventional or proprietary technique as the organic device layer 110.

In the illustrated embodiment, the organic active layer 310 includes an organic active layer 34 over the electrode 14, an organic active layer 36 over the electrode 16, and an organic active layer 38 over the electrode 18. Each of the organic active layer 34, the organic active layer 36, and the organic active layer 38 serves as an electroluminescent ("EL") layer in an OLED and emits radiation. In one embodiment, the organic active layer 34, 36, 38, or any combination thereof emits a portion of the visible light spectrum. In another embodiment, the organic active layer 34, 36, 38, or any combination thereof emits a portion of the UV spectrum, the IR spectrum, or any combination thereof. In a more particular embodiment, each of the organic active layers 34, 36, and 38 includes different radiation-emitting materials and emit a significantly different spectrum of light as compared to the other organic active layers of the organic active layer 310. In yet another embodiment, the organic active layer 34, 36, 38, or any combination thereof is used in a radiation-responsive component, such as a radiation sensor, photovoltaic cell, or the like.

The organic active layer 34, 36, 38, or any combination thereof include material(s) conventionally used as organic active layers in organic electronic devices and can include a small molecule material, a large molecule material, or any combination thereof. The organic active layer 34, 36, 38, or any combination thereof has a thickness in a range of approximately 40 to 100 nm, and in a particular embodiment, a thickness in a range of approximately 70 to 90 nm. In another embodiment, each of the organic active layers 34, 36, and 38 has the same or different thickness as compared to the other organic active layers of the organic active layer 310.

The organic active layer 34, 36, 38, or any combination thereof is deposited using a conventional or proprietary deposition technique. In a more particular embodiment, the deposition technique is a liquid deposition process including a precision deposition process, such as a continuous printing process, an ink-jet printing process, or the like. The organic active layer 34, 36, 38, or any combination thereof is formed using the same or different processes at the same or different time.

Figure 4:
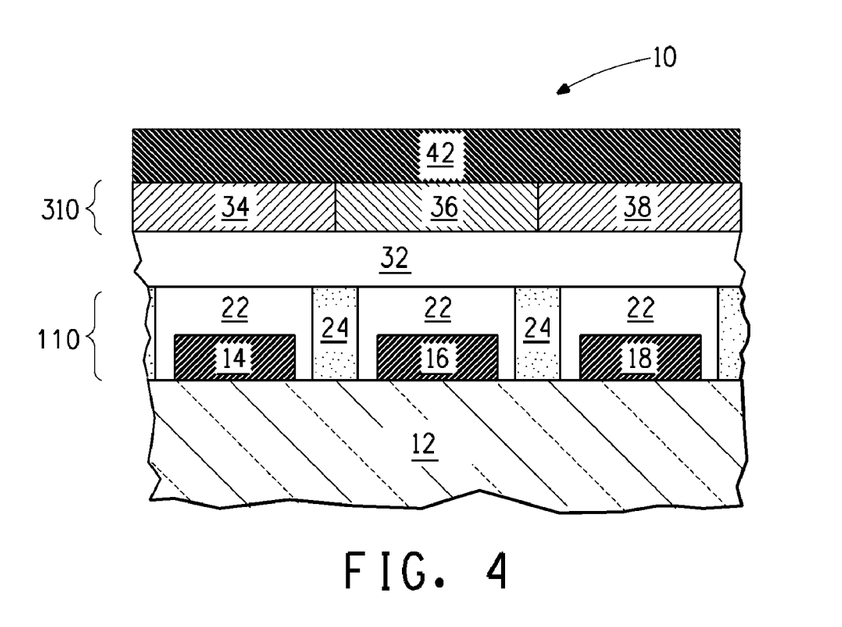
FIG. 4 includes an illustration of a cross-sectional view of the workpiece of FIG. 3 after forming a substantially complete electronic device.

FIG. 4 includes an illustration of a cross-sectional view of a substantially complete electronic device including an electrode 42. Although not illustrated, another organic device layer is optional and would lie between the electrode 42 and the organic active layer 310 and serve as a charge-selective layer. For example, such an organic device layer can be an electron injection layer, and electron transport layer, a hole blocking layer, or any combination thereof. In the illustrated embodiment, the electrode 42 serves as a cathode.

The electrode 42 can include a Group 1 metal, a Group 2 metal, a Group 12 metal, or any combination thereof. In a particular embodiment, the electrode 42 includes an element, alloy, salt, or any combination thereof containing a Group 1 element. In a more particular embodiment, the electrode 42 includes a lithium-containing material such as LiF, Li$_2$O, or any combination thereof. The electrode 42 can have a thickness in a range of approximately 20 to 2500 nm. The electrode 42 can be formed by a conventional or proprietary physical deposition technique and may include more than one layer. In one embodiment, the electrode 42 includes at least one layer deposited using a stencil mask.

Thus an electronic device is formed with an organic device layer 110 selectively modified to including a portion 22 with a higher resistivity than a portion 24. By using such a process, a conducting pathway is defined and charge-flux can be controlled within the electronic device without bank structures.

3. Alternative Embodiments

Some materials used to form an organic device layer may be sensitive to exposure to atmospheric conditions. Using an overlying layer to protect such an exposure-sensitive layer during processing can reduce time constraints between manufacturing processes or widen the range of conditions under which subsequently performed processing can be successfully completed.

Figure 5:
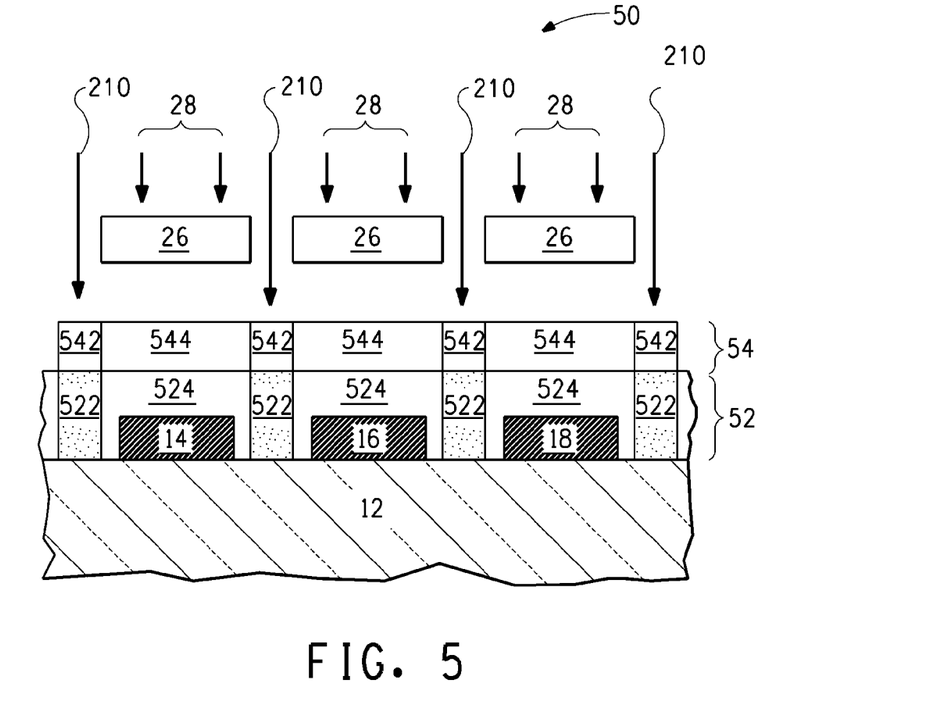
FIG. 5 includes an illustration of a cross-sectional view of workpiece formed in accordance with a particular embodiment.

FIG. 5 includes an illustration of a cross-sectional view of a workpiece 50 according to a particular embodiment. The workpiece 50 includes a substrate 12 and electrodes 14, 16, and 18 as previously described with respect to the workpiece 10. The workpiece 50 also includes an organic device layer 52 and an organic device layer 54. The organic device layer 52 can be similar to the organic device layer 110 of the workpiece 10. In the illustrated embodiment, the organic device layer 52 is a charge-injection layer and can be sensitive to ambient conditions. An organic device layer 54 is deposited over the organic device layer 52. The organic device layer 54 is a charge-transport layer and can serve to protect the organic device layer 52 during the manufacturing process. Each of the organic device layers 52 and 54 can be formed using an embodiment as previously described for the organic device layer 110 of the workpiece 10, and can include the same or different material as compared to each other. In the illustrated embodiment, an organic device layer 54 includes a material less sensitive to ambient conditions than the material of organic device layer 52. The material of the organic device layer 54 may not be affected by the subsequent exposure to the radiation 210.

The workpiece 50 is exposed to radiation as previously described with respect to the workpiece 10 in FIG. 2. A portion 522 of the organic device layer 52 and a portion 542 of the organic device layer 54 are exposed to radiation while the portion 524 of the organic device layer 52 and portion 544 of the organic device layer 54 are not. After the exposure, the portion 522 has a higher resistivity than the portion 524, and in one embodiment, the resistivity of the portion 542 remains substantially unchanged from before the exposure. In a particular embodiment, the organic device layer 52 is formed from an aqueous solution.

Figure 6:
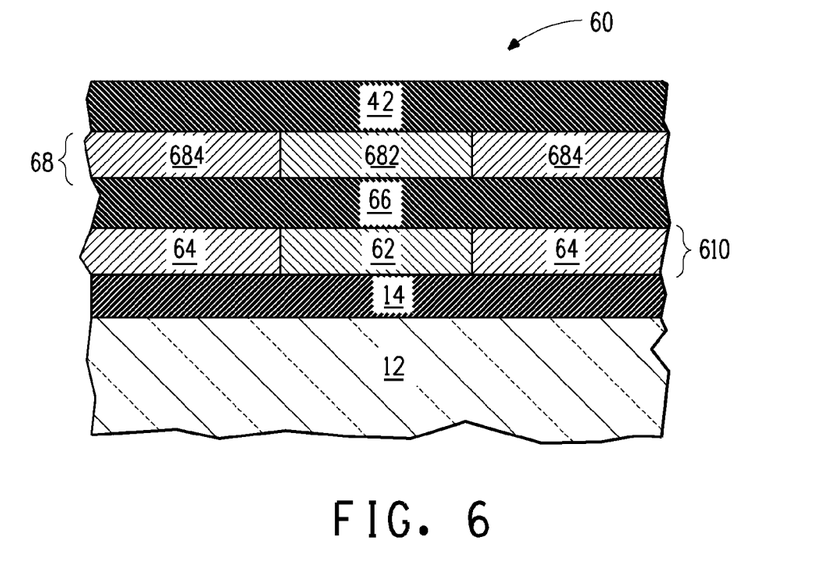
FIG. 6 includes an illustration of a cross-sectional view of workpiece formed in accordance with another particular embodiment.

In other types of electronic devices, such as passive or static electronic displays, forming an organic device layer including a higher resistivity pattern that lies between an anode and a cathode of the electronic device can be useful to help control the current flow to an organic active layer. FIG. 6 includes an illustration of a cross-sectional view of a substantially complete device 60 according to a particular embodiment. The workpiece 60 includes a substrate 12, an electrode 14, and an electrode 42 as previously described for the workpiece 10. The workpiece 60 also includes an organic device layer 610, a charge-selective layer 66, and an organic active layer 68.

In the illustrated embodiment, an organic device layer 610 is deposited over the electrode 14. The organic device layer 610 is selectively modified in a manner similar to that previously described with respect to the organic device layer 110 of the workpiece 10 to form a first portion 62 and a second portion 64 similar to the first portion 22 and the second portion 24 of the organic device layer 110. Each of the first portion 62 and the second portion 64 lies between the electrode 14 and the subsequently formed electrode 42. The first portion 62 is radiation-exposed and has a higher resistivity than the second portion 64.

The charge-selective layer 66 is optional and serves a similar purpose to the charge-selective layer 34 of the workpiece 10. The charge-selective layer 66 can be formed by an embodiment and using a material as previously described for the charge-selective layer 34. The organic active layer 68 is an EL layer. The organic active layer 68 can be formed by an embodiment and using materials as previously described for the organic active layer 310 of the workpiece 10.

In one embodiment, when in use, opposing charge types travel from each of the electrodes 14 and 42 towards the other electrode and can recombine within the organic active layer 68 to form radiation. In such a case, the relatively higher resistivity of the first portion 62 as compared to the second portion 64 can cause relatively fewer recombinations to take place within the region 682 as compared to the region 684. Thus within the organic active layer 68, the region 682 generates significantly less radiation than the region 684. In one embodiment, the region 682 generates substantially no radiation as compared to the region 684. In a particular embodiment, the electronic device 60 can act as a static display.

4. Electronic Device and its Operation

The electronic device may be used by itself or may be incorporated into a system. For example, the electronic device can be a display that can be incorporated into a monitor for a computer, a television, or a display in a mobile communicating device, or the like.

The electronic device can be operated by providing the proper signals and data to the terminals as illustrated in FIG. 4. Appropriate voltages can be provided to the electrodes 14, 16, 18, and 42. In one embodiment, having radiation-emitting components, the electrodes 14, 16, and 18 are coupled to a $V_{DD}$ power supply terminal, and the electrode 42 is coupled to a $V_{SS}$ power supply terminal. In another embodiment, having radiation-responsive components (e.g. sensors), the electrode 42 can be placed at a more positive potential with respect to the electrodes 14, 16, and 18. In a particular embodiment, the electrode 42 can be at a potential of approximately 0 volts, and the electrodes 14, 16, and 18 can be at a potential of approximately −10 volts. When other types of electronic devices are formed (e.g., a photovoltaic array), the voltages or other signals may change accordingly.

5. Advantages

By selectively modifying a charge-selective layer 110, first portions 22 are formed having higher resistivity than second portions 24 to control the current flow within the electronic device. In one embodiment, the first portions 22 lie between electrodes of the same type to help reduce crosstalk between adjacent pixels. Such a use of first portions 22 can allow manufacturing of electronic devices with organic components in closer proximity than with a process such as a bank process.

In another embodiment, an organic device layer 54 is formed over the organic device layer 52 and effectively protects the organic device layer 52 during subsequent processing. Substantially eliminating such contact between the organic device layer 52 and the atmosphere can increase processing flexibility. For example, using such a layer can allow the use of air sensitive materials for the organic device layer 52. In another example it may be possible to perform the selective modification process under a wider range of conditions with the organic device layer 54 overlying the organic device layer 52.

In still another embodiment, the first portion 62 overlies an electrode 14 and reduces the light produced within a region 682 of organic active layer 68. By forming an insulating pattern in an organic device layer lying between the anode and cathode, portions of a pattern of relatively lighter and darker regions can be formed within a continuous electroluminescent layer, also lying between the anode and cathode, when the electronic device would be used.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention. For example, although the specification includes a description of a bottom emitting electronic device, after reading this specifications, skilled artisans should be able to form a top emitting electronic device without undue experimentation.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. An electronic device comprising:
 a first electrode;
 a second electrode; and
 an organic device layer including a first portion and a second portion that has a lower resistivity than the first portion, wherein the organic device layer:
 lies between the first and second electrodes; and
 includes a large molecule material and not more than 15 mole percent of a basic material.

2. The electronic device of claim 1, wherein the organic device layer includes substantially no basic material.

3. The electronic device of claim 1, wherein the first portion of the organic device layer lies between the first electrode and second electrode.

4. The electronic device of claim 3, further comprising a first organic active film, wherein the organic device layer lies between the first organic active film and the first electrode.

5. The electronic device of claim 4, further comprising a substrate, wherein the first electrode and the second electrode each lie between the organic device layer and the substrate.

6. The electronic device of claim 5, wherein the second portion of the organic device layer overlies the first electrode.

7. The electronic device of claim 6, further comprising a second organic active film overlying the second electrode and the organic device layer, wherein:
 substantially none of the first organic active film overlies the second electrode;
 substantially none of the second organic active film overlies the first electrode; and
 the first organic active film and the second organic active film overlie the first portion of the organic device layer.

8. The electronic device of claim 6, further comprising a second organic active film overlying the second electrode and a third portion of the organic device layer, wherein:
 substantially none of the first organic active film overlies the second electrode;
 substantially none of the second organic active film overlies the first electrode;
 the first organic active film overlies the second portion of the organic device layer;
 the first portion of the organic device layer lies between the second portion and the third portion of the organic device layer; and
 the third portion of the organic device layer has a lower resistivity than the first portion of the organic device layer.

9. The electronic device of claim 4, wherein the organic device layer and the first organic active film lie between the first and second electrodes.

10. An electronic device comprising:
 a first pixel including:
 a first electrode;
 a first portion of a organic device layer;
 a first organic active film; and
 a first portion of a common electrode, wherein the first portion of the organic device layer and the first organic active film lie between the first electrode and the first portion of the common electrode, and the organic device layer includes not more than 15 mole percent basic material;
 a second pixel including;
 a second electrode;
 a second portion of the organic device layer;
 a second organic active film; and
 a second portion of the common electrode, wherein the second portion of the organic device layer and the second organic active film lie between the second electrode and the second portion of the common electrode;
 a third pixel including;
 a third electrode;
 a third portion of the organic device layer;
 a third organic active film; and
 a third portion of the common electrode, wherein the third portion of the organic device layer and the third organic active film lie between the third electrode and the third portion of the common electrode;

a fourth portion of the organic device layer lying between the first pixel and the second pixel, and having a higher resistivity than each of the first portion and the second portion of the organic device layer; and a fifth portion of the organic device layer lying between the second pixel and the third pixel, and having a higher resistivity than each of the second portion and the third portion of the organic device layer.

* * * * *